(12) United States Patent
Coe

(10) Patent No.: US 6,948,109 B2
(45) Date of Patent: Sep. 20, 2005

(54) LOW-DENSITY PARITY CHECK FORWARD ERROR CORRECTION

(75) Inventor: Tim Coe, Oxnard, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 510 days.

(21) Appl. No.: 10/044,413

(22) Filed: Oct. 24, 2001

(65) Prior Publication Data

US 2003/0079171 A1 Apr. 24, 2003

(51) Int. Cl.$^7$ ............................................. H03M 13/13
(52) U.S. Cl. ................................................... 714/752
(58) Field of Search ................................ 714/752, 786

(56) References Cited

U.S. PATENT DOCUMENTS

| | | | | |
|---|---|---|---|---|
| 4,295,218 | A | 10/1981 | Tanner | 371/40 |
| 4,547,882 | A | 10/1985 | Tanner | 371/38 |
| 5,446,747 | A | 8/1995 | Berrou | 371/45 |
| 5,930,272 | A | 7/1999 | Thesling | 371/37.01 |
| 6,023,783 | A | * 2/2000 | Divsalar et al. | 714/792 |
| 6,073,250 | A | 6/2000 | Luby et al. | 714/6 |
| 6,081,909 | A | 6/2000 | Luby et al. | 714/701 |
| 6,081,918 | A | 6/2000 | Spielman | 714/746 |
| 6,633,856 | B2 | * 10/2003 | Richardson et al. | 706/15 |
| 6,651,209 | B1 | * 11/2003 | Morsberger et al. | 714/755 |

OTHER PUBLICATIONS

Bazzi, et al., "Exact Threshold and Optimal Codes for the Binary Symmetric Channel and Gallager's Decoding Algorithm A", Bell Labs, Lucent Technologies, Murray Hill NJ, Aug. 22, 1999 (pp. 1–20).

Chung, "On the Construction of Some Capacity–Approaching Coding Schemes", Massachusetts Institute of Technology, Sep. 2000, (pp.. 1–241).

Felstrom, et al., "Time–Varying Periodic Convolutional Codes With Low–Density Parity–Check Matrix", IEEE Transactions on Information Theory, vol. 45, No. 6, Sep. 1999 (pp. 2181–2191).

Davey, "Error–correction using Low–Density Parity–Check Codes", Cavendish Laboratory, University of Cambridge, Dec. 1999 (pp i–vi and 1–107).

Gallagher, "Low–Denisty Parity–Check Codes$^*$", IRE Transactions On Information Theory, Jan. 1962, (pp. 21–28).

Gallagher, "Low–Density Parity–Check Codes" M.I.T. Press, 1963 (pp. 1–102).

Kschischang, et al., "Factor Graphs and the Sun–Product Algorithm", IEEE Transactions on Information Theory, Oct. 19, 2000 (pp. i, ii, 1–50).

Luby, et al., "Improved Low–Density Parity–Check Codes Using Irregular Graphs and Belief Propagation", Digital Systems Research Center, 1998–009, Apr. 15, 1998 (pp. 1–8).

Lustenberger, et al., "An Analog VLSI Decoding Technique for Digital Codes$^*$", IEEE, 0–7803–5474–May 1999 (pp. II–428–431).

MacKay, "Good Error–Correcting Codes based on Very Sparse Matrices", IEEE Transactions on Information Theory, Jan. 1999 (pp. 1–55).

MacKay, "Near Shannon Limit Performance of Low Density Parity Check Codes", Electronics Letters Jul. 12, 1996 (pp. 1–4).

MacKay, "Turbo Codes are Low Denisty Parity Check Codes", Abstract First Draft Jul. 8, 1998, (5 pgs).

(Continued)

*Primary Examiner*—Stephen M. Baker
(74) *Attorney, Agent, or Firm*—Christie, Parker & Hale, LLP

(57) ABSTRACT

A forward correction system using a linked low density parity check (LDPC) code. The linked LDPC code is formed by extending a portion of an original LDPC matrix such that the LDPC code becomes a periodic repeating code.

7 Claims, 7 Drawing Sheets

McEliece, "Achieving the Shannon Limit: A Progress Report", Thirty-Eighth Allerton Conference, Oct. 5, 2000 (62 pgs).

Mitzenmacher, "A Note on Low Density Parity Check Codes for Erasures and Errors", SRC Technical Note, Dec. 11, 1998 (pp. 1–10).

Pfister, et al., "Low Density Check Codes: Decoding Analysis", STAR Group, UCSD, {hpfister, psiegel}@ucsd.edu, Jan. 25, 2000 (pp. 1–14).

T. Richardson and R. Urbanke, "An Introduction to the Analysis of Interative Coding Systems", In B. Marcus and J. Rosenthal, editors, Codes, Systems and Graphical Models, IMA vol. 123, pp. 1–37, Springer–Verlag, 2000.

Richardson, et al., "Design of Provably Good Low–Density Parity Check Codes", Bell Labs, Lucent Technologies, Murray Hill, NJ, Apr. 6, 1999 (pp. 1–35).

Richardson, et al., "Efficient Encoding of Low–Density Parity–Codes", Bell Labs, Lucent Technologies, Murray Hill, NJ, Feb. 7, 2000 (pp. 1–50).

Richardson, et al., "Capacity of Low–Density Parity Check Codes uner Message–Passing Decoding", Bell Labs, Lucent Technologies, Murray Hill, NJ, Nov. 11, 1998 (pp. 1–42).

J. Rosenthal, "An Algebraic Decoding Algorithm for Convolutional Codes", In G. Picci and D.S. Gilliam, editors, Dynamical Systems, Control, Coding, Computer Vision: New Trands, Interfaces, and Interplay, pp. 343–360. Birkäuser, Boston–Basel–Berln, 1999.

Ross, et al., "Implementing & Using Low Density Parity Check Codes—A Portable Toolkit", http://www.people.fas.harvard.edu/–rross/cs222/paper.html, Jan. 17, 2000, (10 pgs).

Wiberg, "Codes and Decoding on General Graphs", Department of Electrical Engineering, Linköping University, L.J. Foto & Montage, Linköping 1996 (pp. v, vii, ix, 1–94).

Worthen, et al., "Low Density Parity Check Codes for Fading Channels with Memory", Proceedings of the 36th Annual Allerton Conference on Communications, Control, and Computing, 1998, (pp. 1–9).

* cited by examiner

LOW-DENSITY PARITY CHECK FORWARD ERROR CORRECTION

BACKGROUND OF THE INVENTION

The present invention relates generally to forward error correction systems, and in particular to forward error correction systems using iteratively decoded codes.

Electronic communication channels provide for the transmission of large quantities of information. Communication channels, however, tend to be noisy. The noise inherent in a communication channel tends to produce errors in the transmitted information. Accordingly, redundant information is often included in transmitted data, with the redundant information allowing a receiver to reconstruct the transmitted message.

A large number of coding schemes exist for determining the amount and nature of the redundant information included in transmitted data. The coding schemes tend to vary somewhat in terms of the number of error bits determinable for a given number of information bits and number of redundant bits, the ability to locate the error bits, the ability to correct burst errors, and other various characteristics. In addition, for any particular coding scheme there tend to be a number of codes available, with the codes often varying in terms of the number of information bits and the number of redundant bits. Further, codes may be systematic, with redundant bits added to, for example, the end of a stream of information bits, or non-systematic, with the information bits and the redundant bits combined in various ways to form a transmitted bit stream.

Coding schemes and actual codes are often selected for use based on various criteria. These criteria include the expected bit error rate (BER) of the transmission system, the desired BER, the amount of transmission overhead associated with a particular code, and the amount of processing necessary to process the code.

Processing of the code generally entails forming code symbols out of information symbols prior to transmission, and determining the information symbols from received versions of the code symbols, i.e. received symbols, upon reception. Forming of code symbols is often termed encoding, and determining the information symbols from received symbols is often termed decoding. Different codes have different processing requirements for encoding and for decoding.

One type of codes are low density parity check codes. Low density parity check codes are discussed, for example, in R. G. Gallager, Low Density Parity Check Codes, IRE Trans. Info. Theory, IR-8:21–28 (January 1962), the disclosure of which is incorporated by reference. Generally, low density parity check codes are parity check codes with a parity check matrix containing mostly zeroes. Somewhat specifically, the parity check matrix may be defined in terms of block length N, the number of ones per column j, and the number of ones per row k (N,j,k). The ones in the parity check matrix are preferably randomly distributed within the matrix.

A parity check matrix may be formed by first generating a submatrix having only a single one per column, and then randomly permutating the columns of the submatrix to form additional submatrices until the entire parity check matrix is formed. Thus, for any (j,k) code a number of parity check matrices of varying, or possibly the same, block lengths may be formed.

An example parity check matrix is provided as FIG. 1. The parity check matrix, sometimes referred to as H, is for a (3,4) regular low density parity check (LDPC) code. The parity check matrix has a block length n of 12. As illustrated the parity check matrix has three ones per column and four ones per row. The parity check matrix is used for code words 12 of symbols based on information words of 3 symbols.

Parity check matrices for LDPC codes are often discussed with respect to their associated bipartite graph. A bipartite graph, at least in this context, includes a number of variable nodes and a number of check nodes. The variable nodes are arranged in a first line and the check nodes are arranged in a second line. The number of variable nodes is the same as the number of symbols in the code word. The number of check nodes is equal to the number of constraints, or checks, placed on the variable nodes. Lines, sometimes referred to as edges, connect the variable nodes and the check nodes, and indicate which checks apply to which variables.

A bipartite graph for the parity check matrix of FIG. 1 is shown in FIG. 2. The graph includes 12 variable nodes and 9 check nodes. Each of the variable nodes 21 is connected by lines 25 to three check nodes, indicating that each variable has three parity checks. Each of the check nodes 23 is connected by lines to four variable nodes, indicating that each check is part of parity checks for four variables.

Decoding may be accomplished using a variety of methods, including using the parity check directly to determine error symbols. More generally, however, error correction capability may be increased using iterative decoding methods such as the sum-product algorithm, or through use of what is sometimes more generally referred to as belief propagation. The sum product algorithm is described more fully, for example, in N. Wiberg, Codes and Decoding on General Graphs, Linkoping Studies in Science and Technology, Dissertations No. 440 (Linkoping University, 1996), the disclosure of which is incorporated by reference. In short, in these methods probabilities of symbol values are determined and assigned to variables, and then redetermined and assigned multiple times.

SUMMARY OF THE INVENTION

The present invention therefore provides a forward error correction system including a linked iteratively decoded code. In one embodiment the invention comprises a method of forming sets of code symbols out of a series of sets of code symbols for use in a systematic iteratively decoded code. In a method comprising forming a first set of code symbols by forming a number of code symbols from a first set of data symbols and forming a second number of code symbols using the first set of data symbols and the previously formed code symbols, at least some of the second number of code symbols are formed using code symbols that were formed using a previously formed set of code symbols. In a further embodiment the method further comprises forming a second set of code symbols. The second set of code symbols are formed by forming a further second number of code symbols from a second set of data symbols and forming further second member of code symbols using the second set of data symbols and previously formed code symbols. At least some of the further second member of code symbols are formed using at least some of the second member of code symbols.

In a further embodiment of the invention, the invention comprises a method of forming code bits for use in a system employing a linked low density parity check code. The method comprises receiving a data stream comprising data bits $d_1 \ldots d_{1A}, d_2 \ldots d_{2a} \ldots d_y \ldots d_{ya} \ldots d_x \ldots d_{xa} \ldots$. The method further comprises forming a code stream comprising code bits $c_1 \ldots c_{1A} \ldots c_{1B}, c_2 \ldots c_{2a} \ldots c_{2b} \ldots c_y \ldots c_{ya}, c_{ya+1} \ldots c_{yb} \ldots c_x \ldots c_{xa}, c_{xa+1} \ldots c_{xb} \ldots$ where $c_x \ldots c_{xa}$ are $d_x \ldots d_{xa}$. At least some of the bits $c_{xa+1} \ldots c_{xb}$ are an XOR combination of prior bits including at least some of the bits $c_{ya+1} \ldots c_{yb}$.

A further embodiment of the invention provides a forward error correction system. The forward error correction system uses iteratively decoded codes. The system comprises an encoder. The encoder encodes information symbols to form code symbols. The code symbols are comprised of sets of code symbols, a current set of code symbols comprising a number of code symbols formed of information symbols and a number of code symbols formed using information symbols, code symbols with a previous set of code symbols, and previously formed code symbols of a current set of code symbols. The system further comprises a decoder, the decoder iteratively decoding the code symbols. In a further embodiment of the invention the code symbols are formed using an XOR operation. In one embodiment the XOR operation is accomplished in accordance with a linked low density parity check code. In a further embodiment the linked LDPC code is formed by extending a portion of an original LDPC matrix. In one embodiment the portion of the original LDPC matrix comprises a base portion, an upper extending portion, and a sideways extending portion.

These and other aspects of the present invention will be more fully appreciated upon examination of the following drawings and detailed description.

BRIEF DESCRIPTION OF THE DRAWINGS

Figure 1:
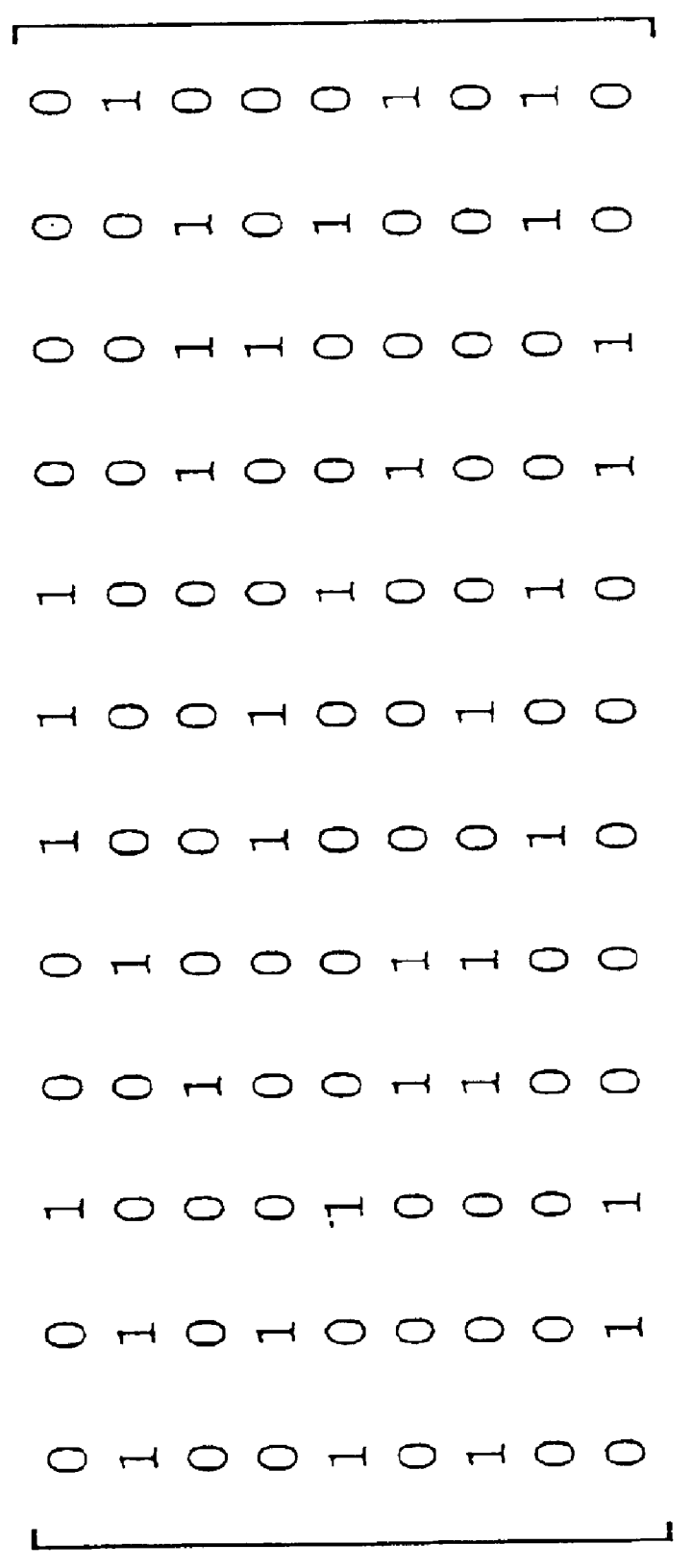

FIG. 1 illustrates a low density parity check matrix.

DETAILED DESCRIPTION

Figure 2:
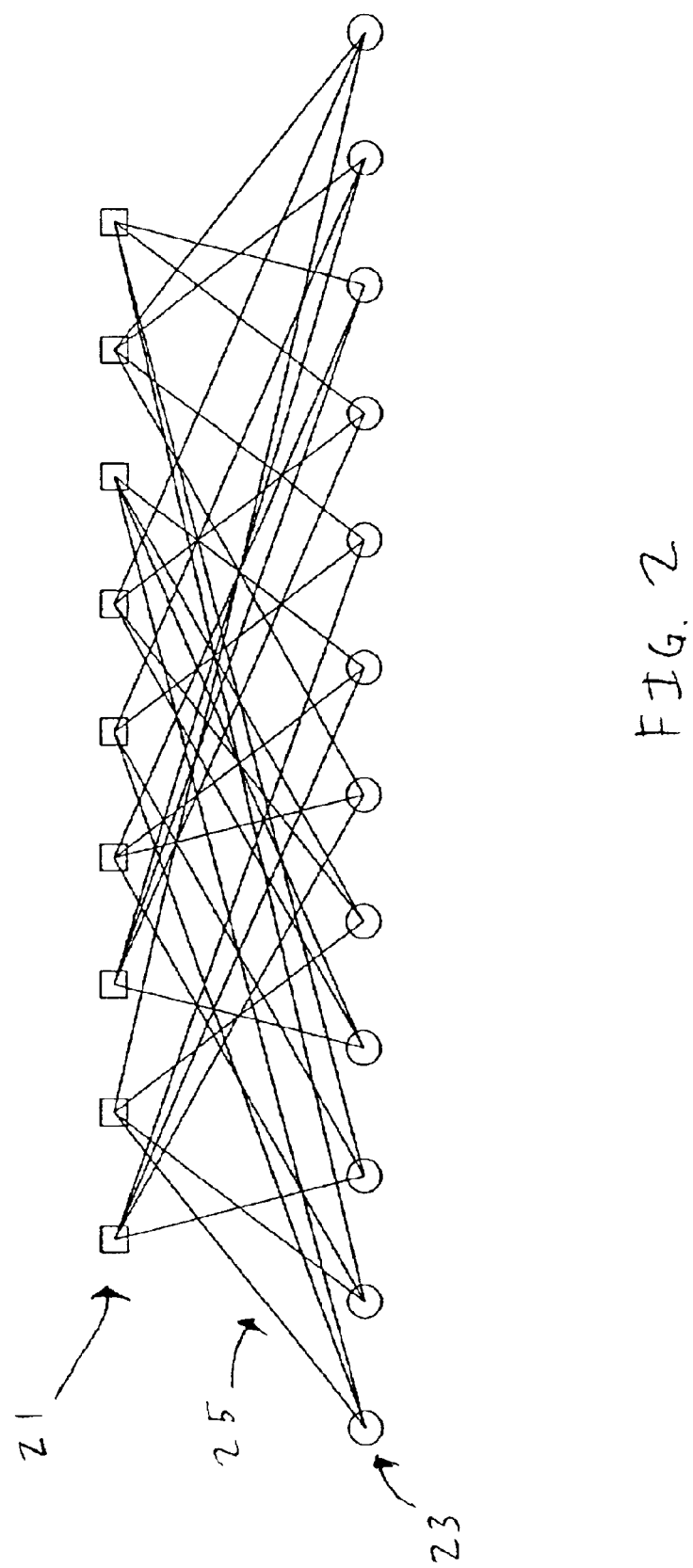
FIG. 2 is a bipartite graph associated with the parity check matrix of FIG. 1.
Figure 3:
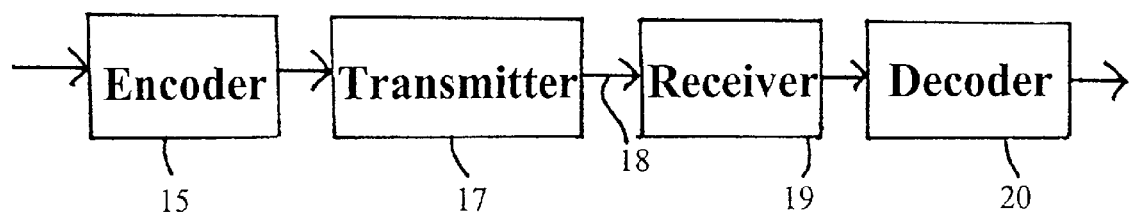
FIG. 3 illustrates a transmission system in accordance with the present invention.

FIG. 3 illustrates a data transmission system in accordance with the present invention. A data stream comprising information words is provided to an encoder 15. The encoder forms code words using the information words. The encoder provides the code words to a transmitting unit 17. The transmitting unit transmits the code words over a transmission media 18. In one embodiment, the transmission media is an optical fiber and the code words are transmitted serially over the optical fiber. In another embodiment, the transmitting unit is an RF transmitter and the code words are transmitted through space.

After the code words are passed through the transmission media, the code words are received by a receiving unit 19. Upon receipt by the receiving unit the code words are provided to a decoder 20. The decoder decodes and corrects the received signal, thereby extracting the information signal.

Figure 4:
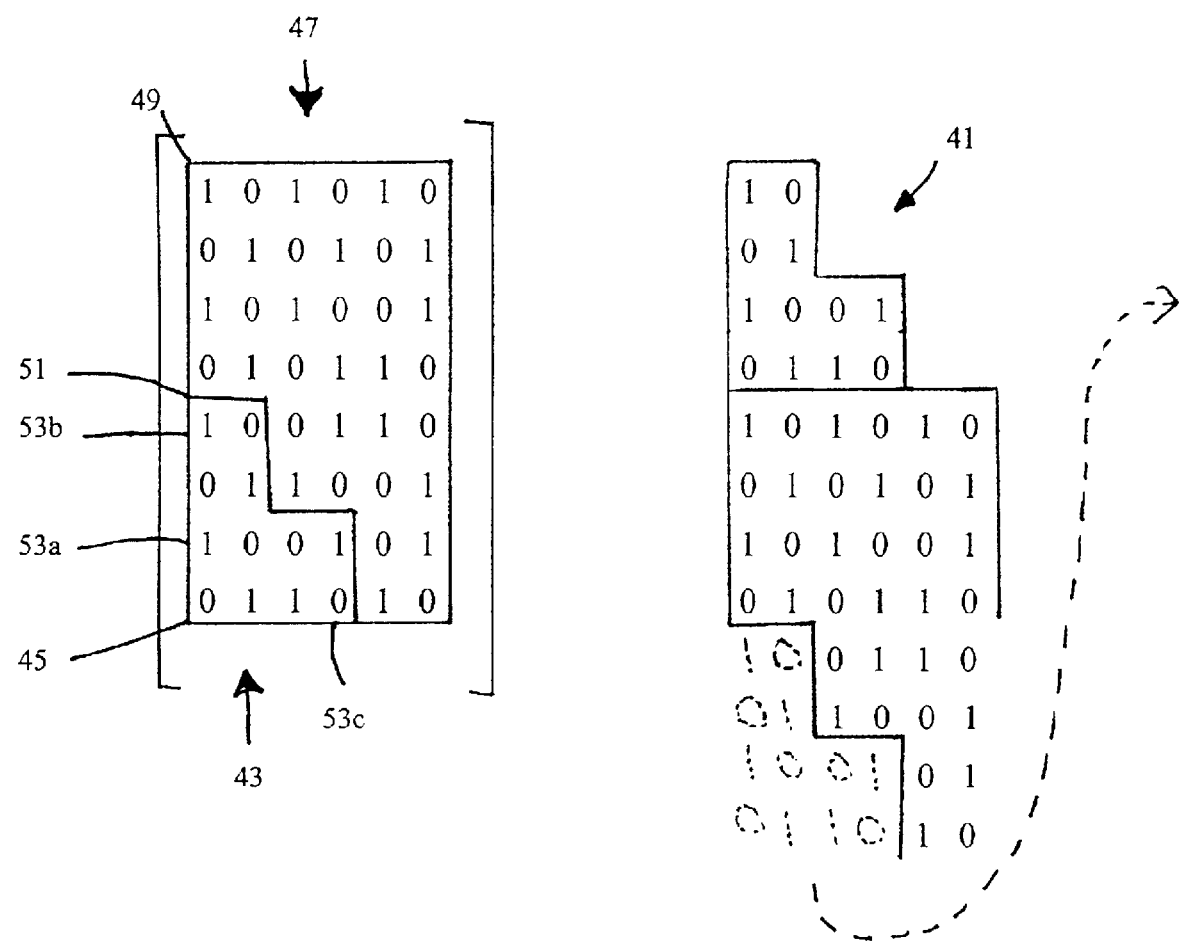
FIG. 4 is a parity check matrix in accordance with aspects of the present invention.

The present invention uses, in one embodiment, a linked LDPC code. Aspects of the linked LDPC code may be understood with respect to FIG. 4. FIG. 4 illustrates a parity check matrix 41 in accordance with aspects of the present invention. Preferably, the parity check matrix is a low density parity check matrix with the matrix primarily comprised of zeros, with ones sparsely populating the matrix. For purposes of example, however, the parity check matrix of FIG. 4 has a relatively heavy weighting of ones.

As illustrated, a portion 43 of the matrix is extended. The extended portion may be viewed as originating approximate a lower left corner 45 of an original matrix 47, and being placed above approximate an upper left corner 49 of the original matrix. The extended portion is formed of a number of matrix elements below a psuedo-diagonal 51 of the matrix. The psuedo-diagonal delineates a series of block-wise elements 53a,b,c, about the lower left corner of the matrix. Thus, the original matrix of FIG. 4 is an 8×6 matrix. The extended portion includes a first block 53a comprised of the elements (5,1), (5,2), (6,1), and (6,2). A second block 53b is formed of elements (7,1), (7,2), (8,1), and (8,2). A third block 53c is formed of elements (7,3), (7,4), (8,3), and (8,4). The second element therefore forms a base block in the lower left corner of the original matrix. The first block is an upward extending block extending upward from the base block. The third block is a sideways extending block extending sideways into the original matrix from the base block.

In operation, the extended portion pertains to, and is correlated with, previously transmitted data. The main portion of the matrix pertains to, and is correlated with, subsequently transmitted data. The subsequently transmitted data, therefore, is linked with the previously transmitted data.

Figure 5:
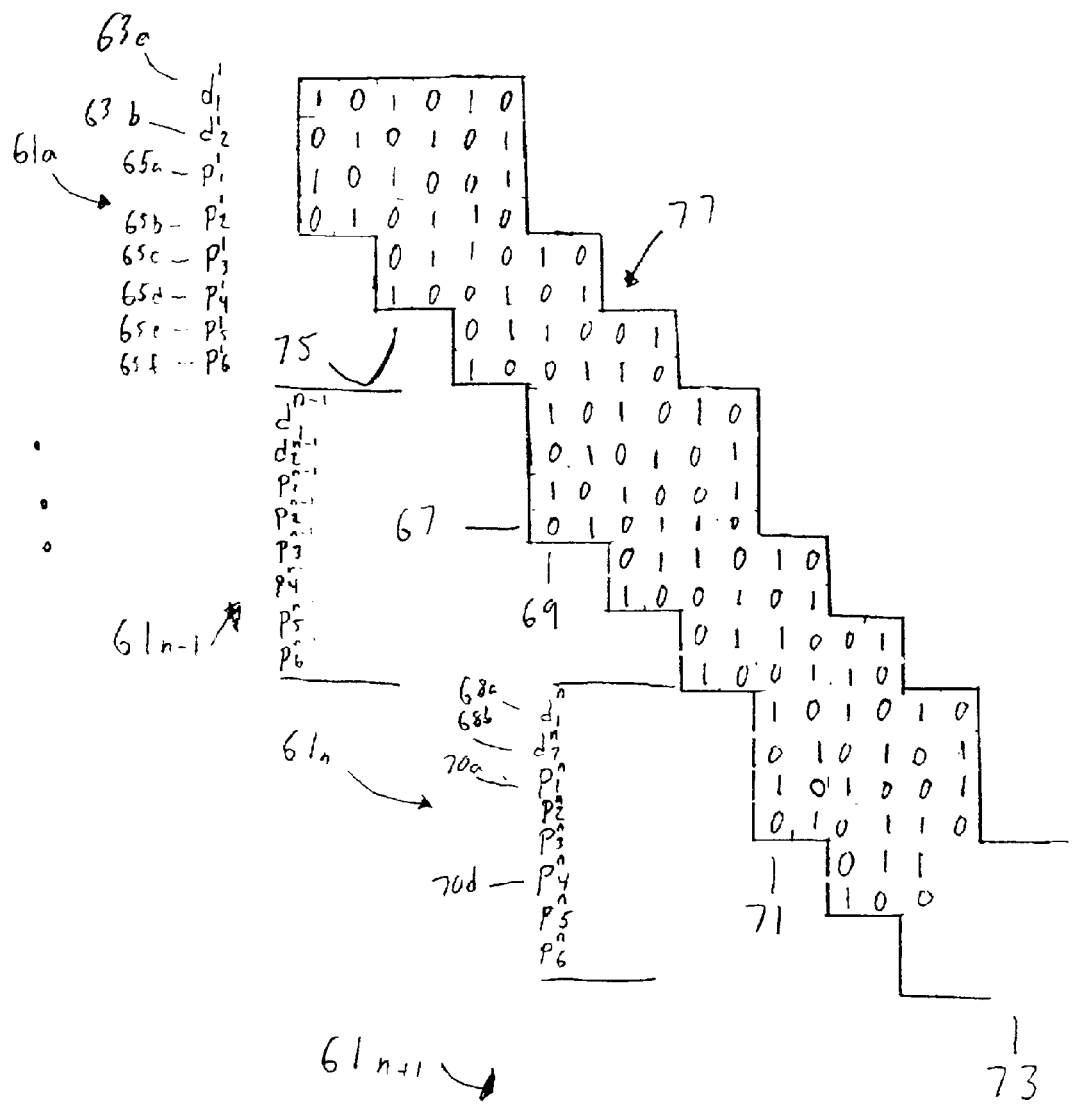
FIG. 5 illustrates use of the parity check matrix of FIG. 4.

Decoding using the parity check matrix of FIG. 4 may be described with respect to FIG. 5. FIG. 5 illustrates parity checks using the parity check matrix of FIG. 4 on a received transmitted data stream. The received transmitted data stream includes a series of sets 61a,n of transmitted code words resulting in received words. Each set of transmitted code words has two data bits 63a,b and six parity check bits 65c–f. Each of the bits of the received word have three parity checks 67, and each of the parity checks uses four bits 69. The code, therefore, is a (3,4) code.

Using a set of data and parity bits from an approximate midpoint of a transmission stream as an example, it may be seen that parity checks utilize parity bits from a previously transmitted set in the series of sets. For example, a first parity check 71 uses bits from an nth received set 61n and bits from an n−1 received set 61n−1. Similarly, some of the parity bits from the current series are used in parity checks for subsequently transmitted series. For example, a second parity check 73 uses bits from the nth received word and from an n+1 received word.

As illustrated in FIG. 5, the two data bits do not include parity checks from a removed portion 75 of the parity check matrix. Instead, a portion of the removed portion is extended from operation on a prior set. This extended portion 77 is used to generate parity check bits used for checking data bits. Similarly, some of the parity check bits also have parity checks performed on them using portions of the extended matrix. Finally, a portion of the parity bits are used for checks in subsequent sequences.

Thus, in one embodiment, transmitted bits other than a first set of data bits have parity checks which depend on previously transmitted bits. Similarly, transmitted bits are included in parity checks utilizing subsequently transmitted bits. In other words, transmitted data is decoded in a substantially non-segmented manner with subsequent decoding able to be used to correct errors in previously transmitted bits.

Figure 6:
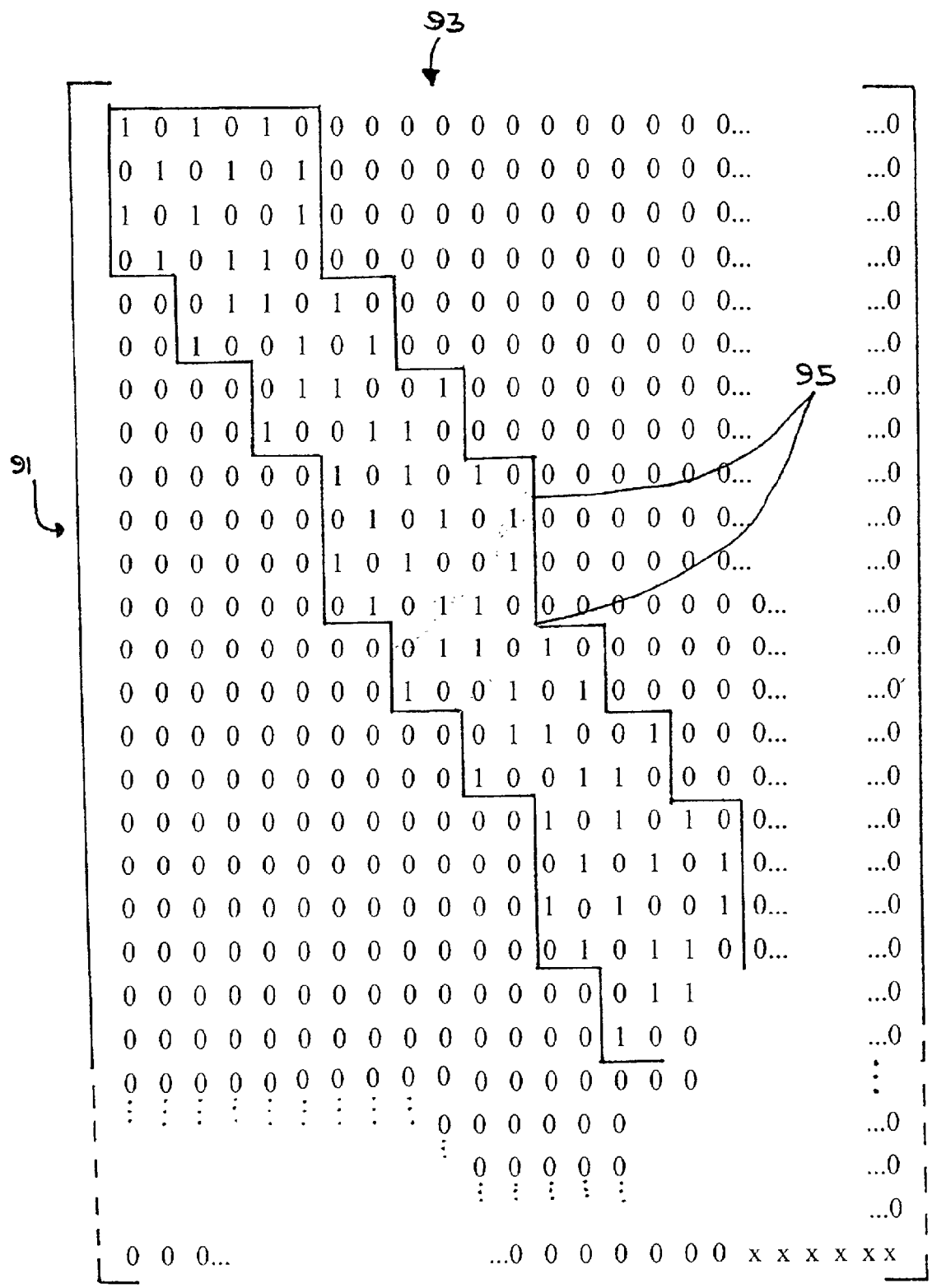
FIG. 6 illustrates a band matrix forming a parity check matrix in accordance with aspects of the present invention.

Alternatively, the parity checks of FIG. 5 may be viewed as similar to a large band matrix. Such a band matrix is shown in FIG. 6. The band matrix has a number of rows 91 equal to the number of transmitted bits in the data stream. The number of columns 93 is dependent on the order of the code used to generate the transmitted bits, and the number of transmitted bits. Within the band the values of the matrix repeat on a periodic basis, the period being related to the size of the code. The periodicity of the elements of the band are useful in allowing for the use of repeating algorithms in decoding.

The width 95 of the band matrix bounds the number of bits used in parity checks for any particular bit. The width of the band therefore also bounds the number of bits used to encode the information words during encoding. As illustrated, the width of the band is always greater than one, that is does not reduce at of any point to merely the diagonal elements of the matrix. However, the width of the band is also not uniform. Instead, the width of the band varies along with the periodic basis of the repeating values of the matrix.

A code in accordance with the present invention may therefore be considered a repeating infinite length low density band matrix parity check code. The code is repeating in that the parity checks are repeating in nature.

Figure 7:
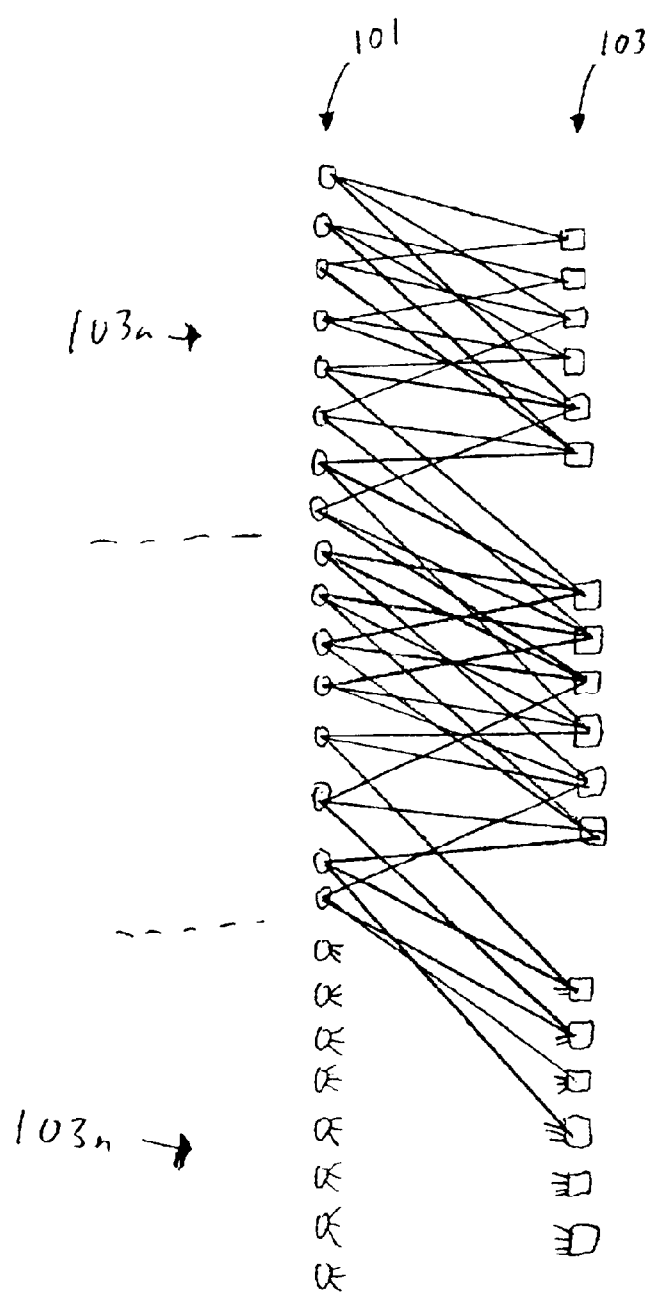
FIG. 7 is a bipartite graph associated with a parity check accomplished for the data transmission format of FIG. 4 of an encoding operation in accordance with the present invention.

The effective length of the code may also be understood with reference to FIG. 7. As illustrated in FIG. 7 the bipartite graph includes a sequence of variable nodes 101 and a sequence of check nodes 103. The sequence of variable nodes is as long as the number of bits in the transmitted code words 103a . . . n. When viewing the bipartite graph of FIG. 7, it may be seen that the relationship between check nodes and variable nodes is such that changes in value of a variable unassociated with a specific code word may result in correction of a variable associated with some other code word anywhere in a sequence of code words.

Moreover, use of a system in accordance with FIG. 7 does not unduly increase the time and space necessary to perform encoding operations. As the previous discussion indicates, the code is systematic and the data bits form part of the code word. The parity bits are determined so as to fullfill the appropriate parity check equations determined by the parity check matrix. As all parity checks are to be satisfied, each parity check bit can be determined using any of the parity check equations. Conveniently, each parity check bit is used in a parity check otherwise made up of previous data bits and previous parity bits.

Accordingly, each parity bit in one embodiment, is determined by XORing the appropriate previously known or determined bits. For example, information bits are provided to the encoded of FIG. 3. The information bits are part of a stream of information bits, and are used to form code bits. Previously formed code bits are also used in forming the code bits. The information bits themselves form code bits as the code is a systematic code. Successive code bits are then formed using previously formed code bits. The data bits and the successive code bits form a set of code bits. The previously formed code bits comprise the code bits formed of the data bits and code bits from the previous set of code bits. The process continues in this fashion the length of the stream of information bits.

Using the code of FIG. 5 as an example, the code bits include a set of code bits 61n. The first two code bits 68a,b are formed of information bits. The third code bit 70a is formed by selectively XORing the data bits and code bits from a previous set of code bits 61n−1. For example, a sixth code bit 70d is formed by selectively XORing code bits from the previous set of code bits, the data bits, and already calculated code bits from the current set of code bits.

The present invention therefore provides a forward error correction system method. Although the invention has been described with respect to certain specific embodiments, it should be recognized that those skilled in the art would recognize how to implement the invention within substantial changes. Thus, the present embodiments should be considered exemplary only, with the invention being defined by the claims and their equivalents supported by this disclosure.

What is claimed is:

1. A method of decoding transmitted bits to recover a data signal, the method comprising:

receiving a stream of transmitted bits, the transmitted bits being encoded in accordance with an extended low density parity check matrix, the extended low density parity check matrix having an extended portion formed of a plurality of blocks of an original low density parity check matrix, each block having the same number of elements and elements within each block having the same relationship to each other within the original low density parity check matrix, the blocks of the extended portion of the original low density parity check matrix being formed of elements below a pseudo-diagonal of the original low density parity check matrix; and iteratively decoding the transmitted bits.

2. A forward error correction system using iteratively decoded codes, the system comprising:

an encoder, the encoder encoding information symbols to form code symbols, the code symbols comprising sets of code symbols, a current set of code symbols comprising a number of code symbols formed of information symbols and a number of code symbols formed using information symbols, code symbols of a previous set of code symbols, and previously formed code symbols of a current set of code symbols;

a decoder, the decoder iteratively decoding the code symbols;

wherein the number of code symbols formed using information symbols, code symbols of a previous set of code symbols, and previously formed code symbols of a current set of code symbols is formed using an XOR operation;

wherein the XOR operation is accomplished in accordance with a linked low density parity check (LDPC) code;

wherein the linked LDPC code is formed by extending a portion of an original LDPC matrix;

wherein the portion of the original LDPC matrix comprises a base portion, an upper extending portion, and a sideways extending portion;

wherein the base portion, the upper extending portion, and the sideways extending portion contain an equal number of elements;

wherein the base portion originates about a lower corner of the original LDPC matrix;

wherein each element of the upper extending portion is above each element of the base portion; and wherein each element of the sideways extending portion is to the side of each element of the base portion.

3. The system of claim 2 wherein the portion of the original LDPC matrix comprising the base portion, the upper extending portion, and the sideways extending portion is formed of a number of blocks below a psuedo-diagonal of the original LDPC matrix.

4. The system of claim 3 wherein the psuedo-diagonal delineates a series of blockwise elements about a lower left corner of the original LDPC matrix.

5. The system of claim 4 wherein each of the base portion, the upper extending portion, and the sideways extending portion each form a block.

6. The system of claim 5 wherein each block has its elements in the same relation to one another within the original LDPC matrix.

7. The system of claim 6 wherein each block includes a plurality of elements.

* * * * *